(12) United States Patent
Naik et al.

(10) Patent No.: US 8,053,724 B2
(45) Date of Patent: Nov. 8, 2011

(54) REAL-TIME S-PARAMETER IMAGER

(75) Inventors: Pranab Sabitru Naik, Hong Kong (CN); Christopher David Beling, Hong Kong (CN); Stevenson H. Y. Fung, Hong Kong (CN)

(73) Assignee: The University of Hong Kong, Hong Kong (HK)

( * ) Notice: Subject to any disclaimer, the term of this patent is extended or adjusted under 35 U.S.C. 154(b) by 0 days.

(21) Appl. No.: 12/816,218

(22) Filed: Jun. 15, 2010

(65) Prior Publication Data

US 2010/0322505 A1     Dec. 23, 2010

Related U.S. Application Data

(60) Continuation of application No. 11/797,621, filed on May 4, 2007, now Pat. No. 7,781,732, which is a division of application No. 10/890,723, filed on Jul. 14, 2004, now Pat. No. 7,420,166.

(51) Int. Cl.
*H01J 37/256* (2006.01)
*G01N 23/22* (2006.01)

(52) U.S. Cl. ......... 250/308; 250/307; 250/309; 250/310

(58) Field of Classification Search .................. 250/307, 250/309, 310
See application file for complete search history.

(56) References Cited

U.S. PATENT DOCUMENTS

| | | | |
|---|---|---|---|
| 3,825,759 A | | 7/1974 | Hall |
| 4,064,438 A | | 12/1977 | Alex et al. |
| 5,870,051 A | * | 2/1999 | Warburton et al. ........... 341/155 |
| 5,873,054 A | * | 2/1999 | Warburton et al. ........... 702/190 |
| 6,043,489 A | | 3/2000 | Tongbhoyai et al. |
| 7,420,166 B2 | | 9/2008 | Naik et al. |
| 7,781,732 B2 | | 8/2010 | Naik |
| 2007/0265789 A1 | | 11/2007 | Naik et al. |

OTHER PUBLICATIONS

Scanning Electron Microscope, Wikipedia, Jun. 6, 2007, pp. 1-8.
Schultz et al., "Interaction of Positron Beams With Surfaces, Thin Films, and Interfaces", Reviews of Modern Physics, vol. 60, No. 3, Jul. 1988, pp. 701-781.
Coleman, Paul, "Positron Depth Profiling", Materials Science Forum vols. 363-365, 2001, pp. 420-424.
Djourelov et al., "Source Correction in Positron Annihilation Lifetime Spectroscopy", 1996, J. Phys: Condens. Matter, vol. 8, pp. 2081-2087.

(Continued)

*Primary Examiner* — David A Vanore
(74) *Attorney, Agent, or Firm* — Berkeley Law & Technology Group LLP

(57) ABSTRACT

An instrumentation setup is provided to process electronic signals in a positron imager functioning in two different modes of operations for scanning both bulk and thin film materials. According to one part of an implementation, an instrumentation setup comprises an XY-rastering stepper motor apparatus coupled with LVDTs (Linear Variable Differential Transformers), and nuclear signal processing and high speed data acquisition sections. Imaging of bulk material samples may be enabled by scanning a positron point source across a surface of samples. In another part of the irnplenientation, the instrumentation setup may comprise an electromagnetic deflection control arrangement in conjunction with a guided monoenergetic positron beam together with nuclear signal processing and data acquisition arrangements. This part of the implementation may scan and produce images for thin film samples. The instrumentation setup is capable of producing high quality real-time S-parameter images.

20 Claims, 22 Drawing Sheets

The Electronics setup of the Imager.

OTHER PUBLICATIONS

Dlubek et al., "Positron Study of Native Vacancies in Doped and Undoped GaAs", J. Phys. C: Solid State Phys., vol. 19, 1986, pp. 331-344.

Männig et al., "Defect Production by the TEM Beam—the First Application of the Positron Microprobe", Applied Surface Science, vol. 149, 1999, pp. 217-220.

Manti et al., "Defect Annealing Studies on Metals by Positron Annihilation and Electrical Resistivity Measurements", Physical Review B, vol. 17(4), Feb. 15, 1978, pp. 1645-1652.

Krause-Rehberg et al., "Positron Annihilation in Semiconductors", Spring, 1999, p. 201.

* cited by examiner

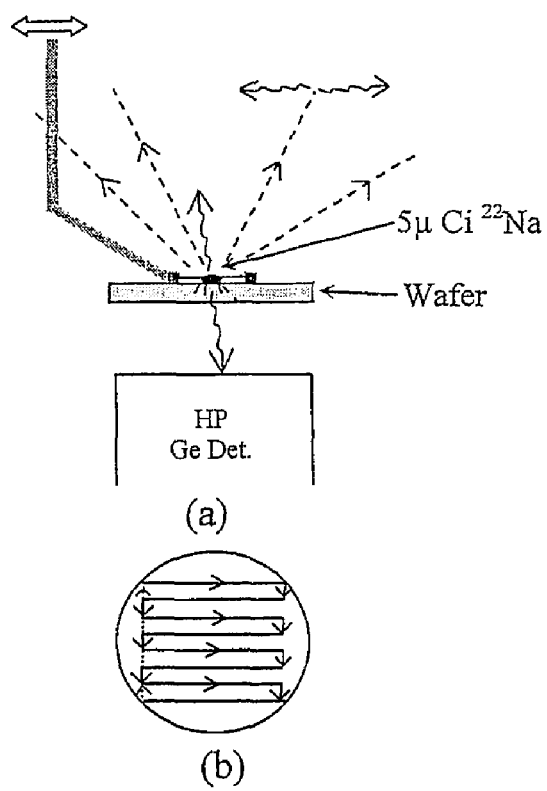
Figure-1: Source and scanning setup together with wafer and detector (a) side view (b) top view of wafer showing motion of the source

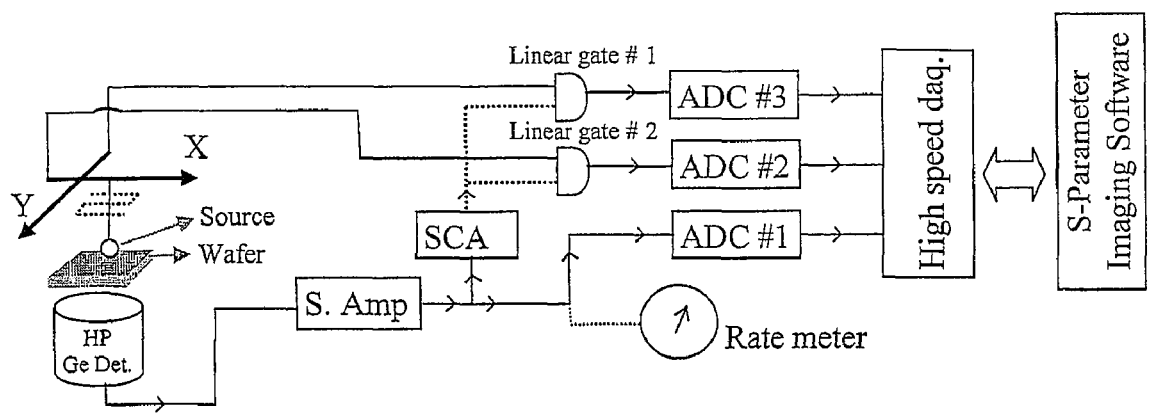
Figure-2 : The Electronics setup of the Imager.

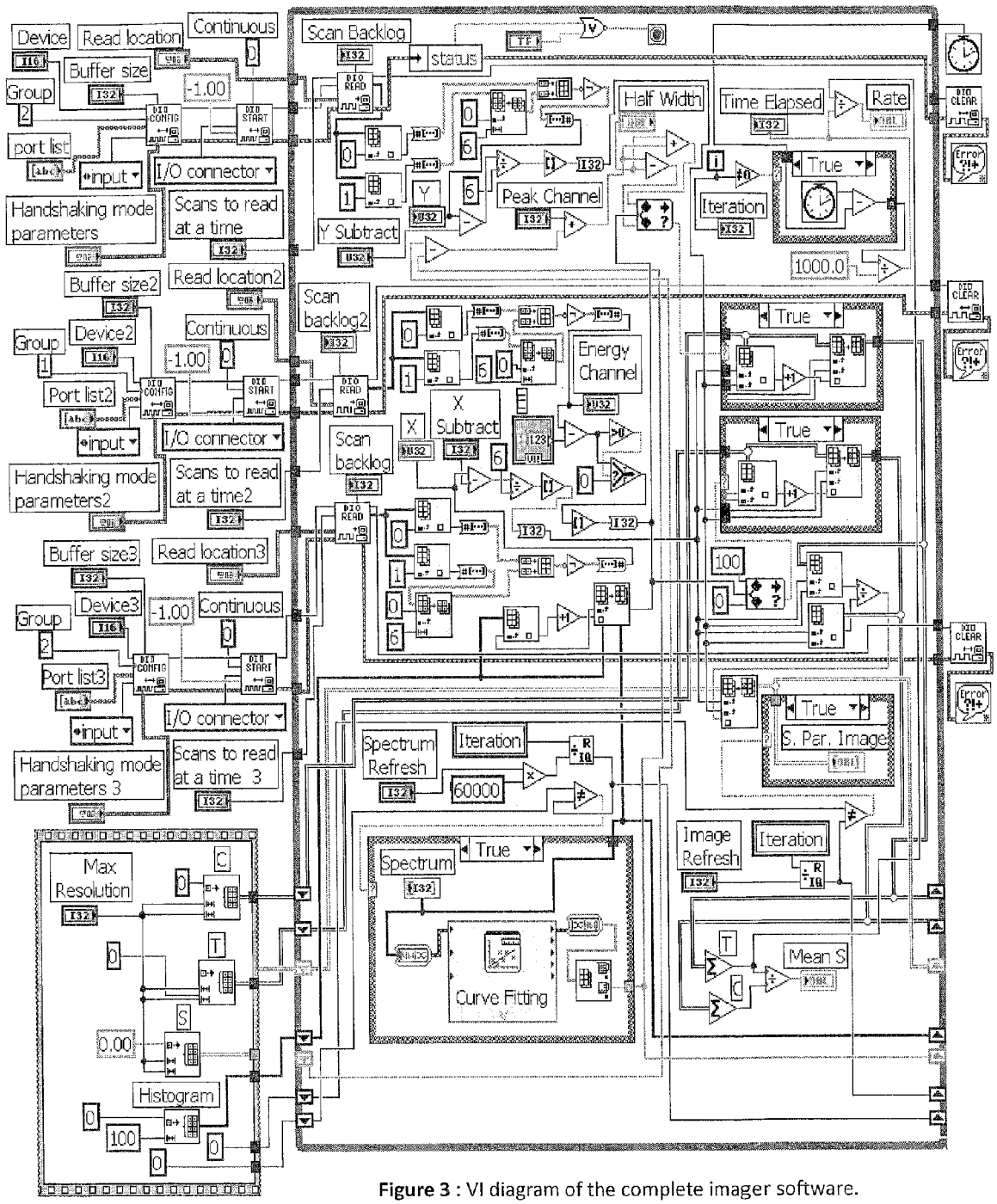
Figure 3 : VI diagram of the complete imager software.

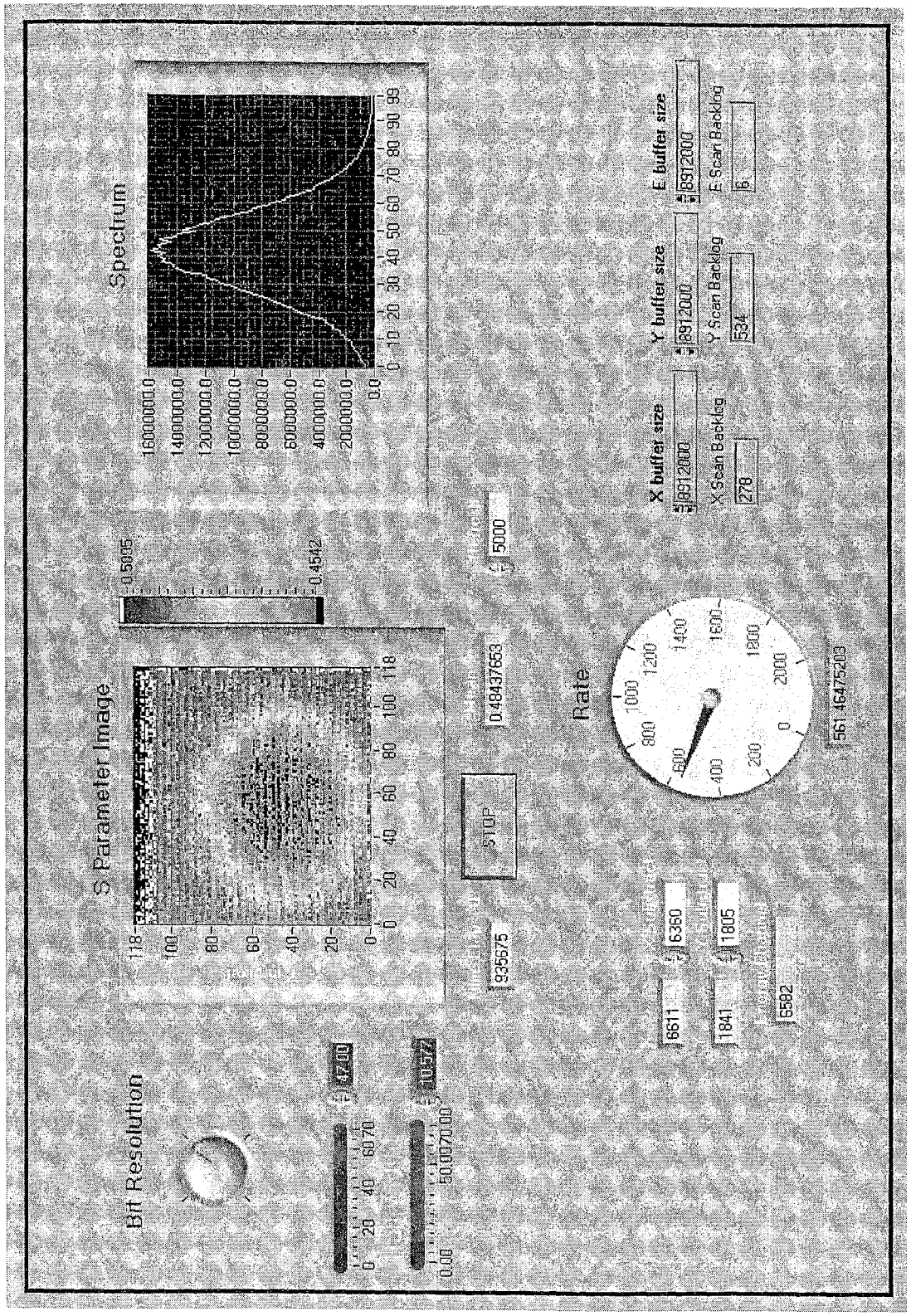
Fig. 4 : Front Panel of the imager software.

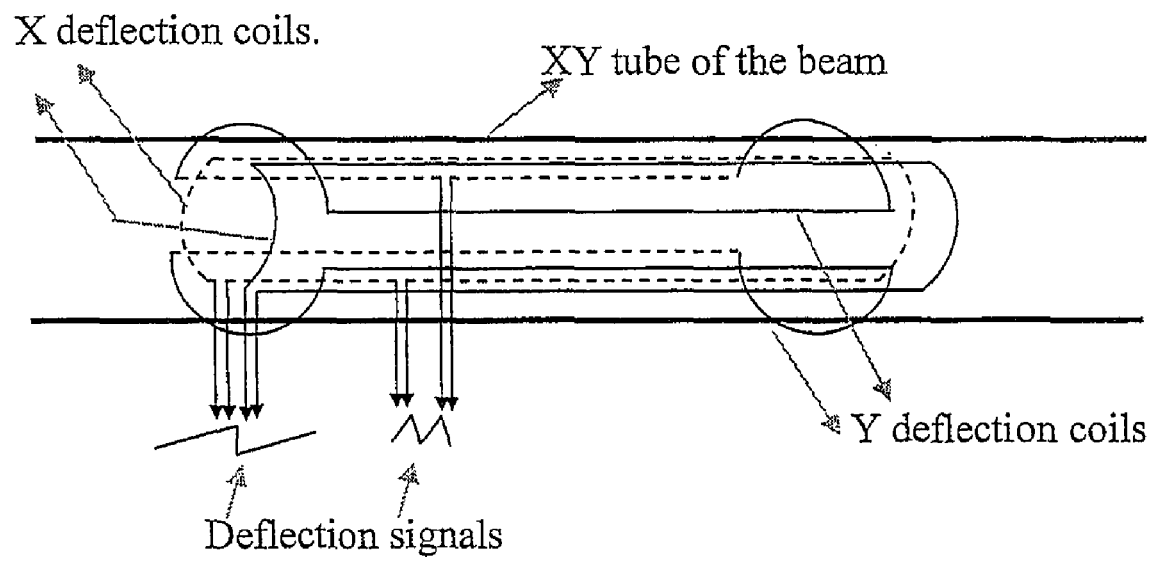
Fig 5 : Side view of the XY deflection coils.

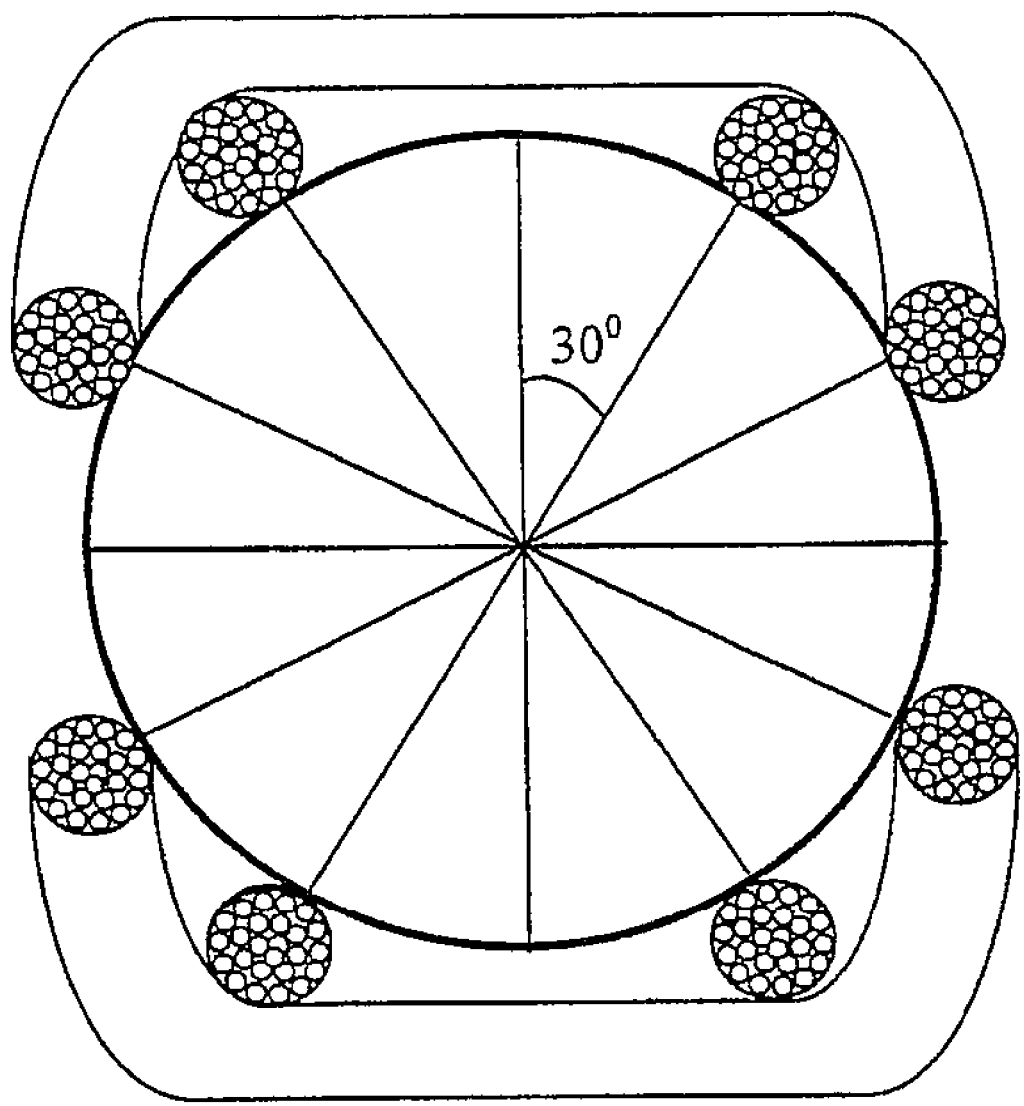
Fig 6 : Crossectional view of the XY coil

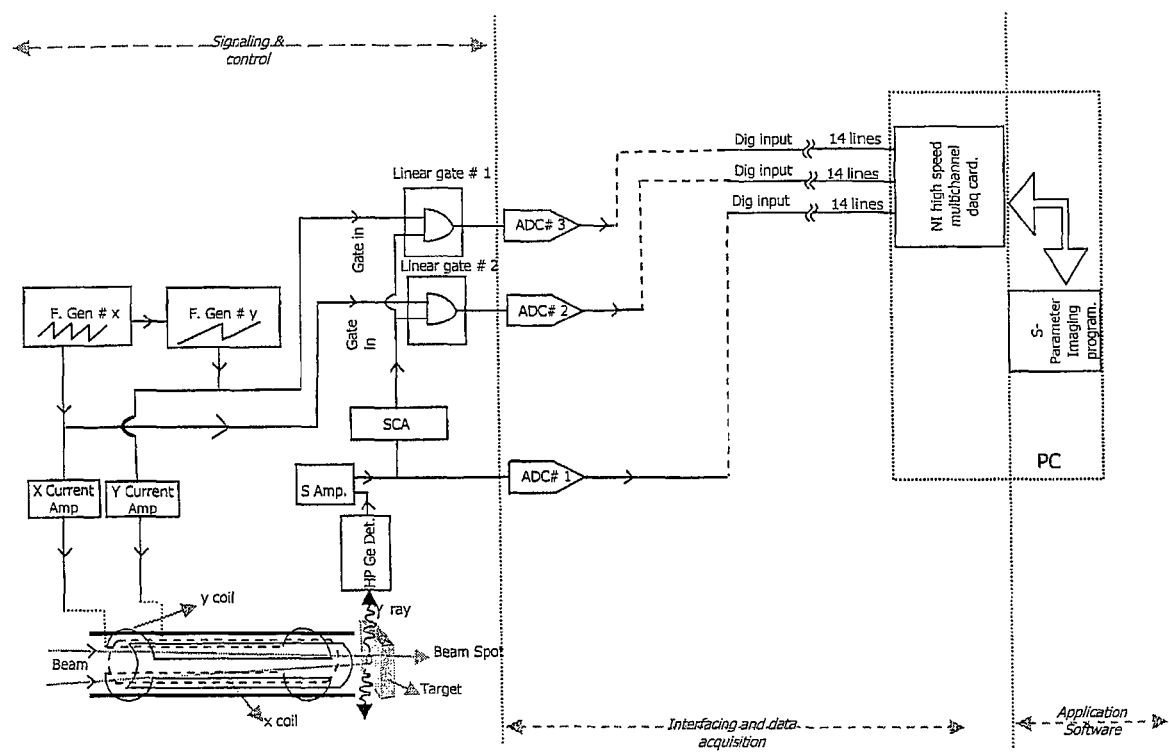
Fig 7 : Block diagram of the complete imager setup circuitory applied to positron beam.

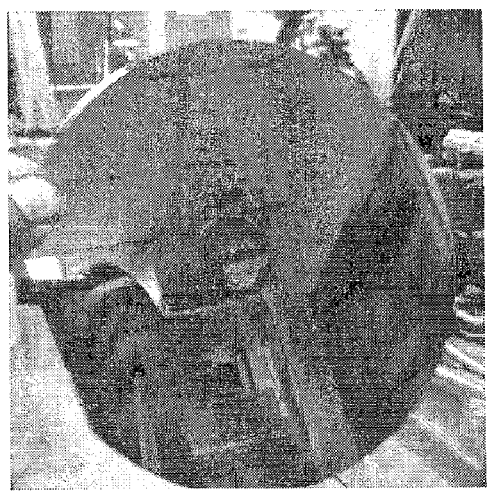 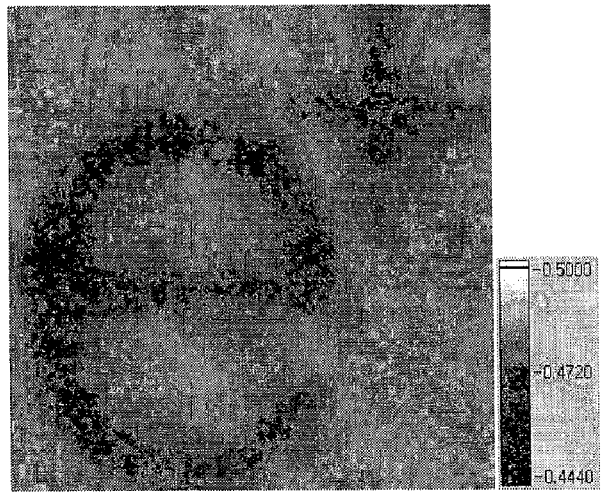
(A) (B)
Fig 8 : e⁺ symbol(3.5cm x 3.5cm) made up of 0.5mm kapton film pasted on a Silicon wafer. (A) Photographic image (B) S-parameter image.

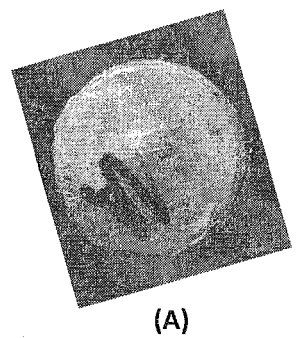
(A)
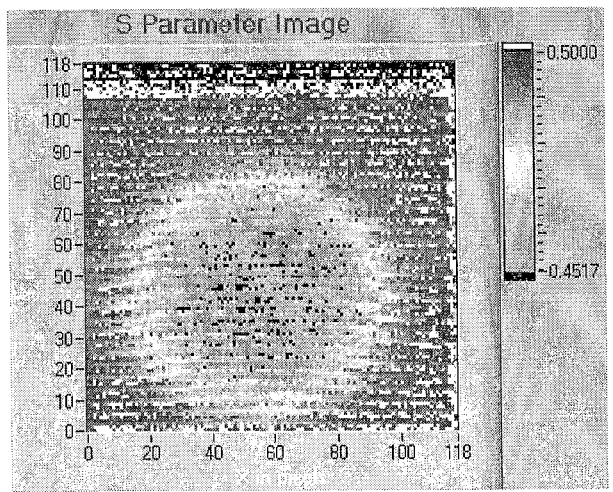
(B)
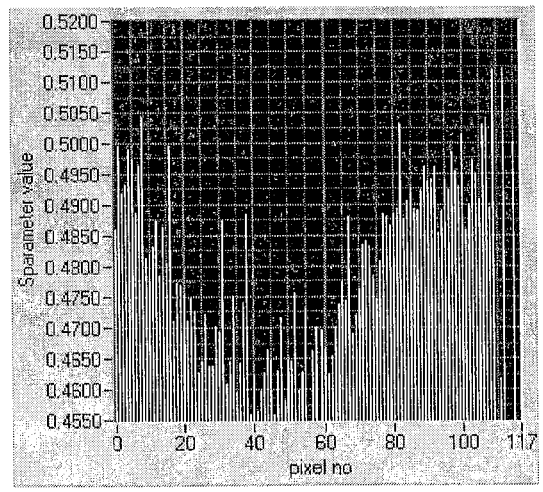
(C)
Fig 9: Monocrystalline Ni sample(diameter ≈1cm). (A) Photograph; (B) S-parameter image; (C) Bar-chart plotting of the S-parameter value versus the pixel number along row 55 of Fig 9B.

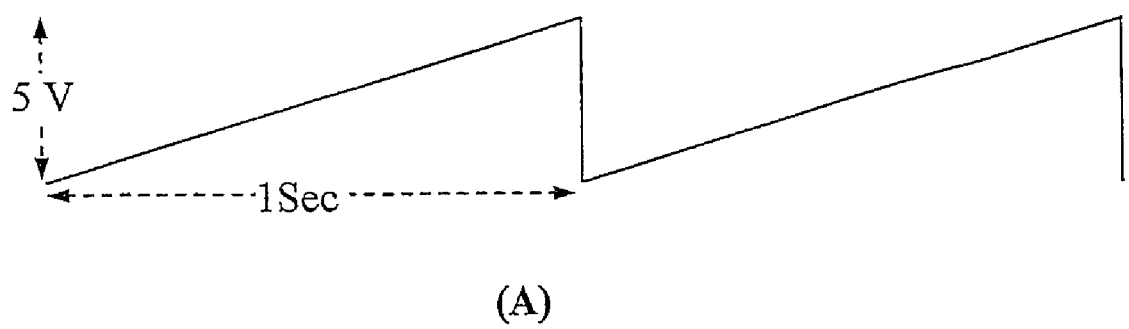
(A)
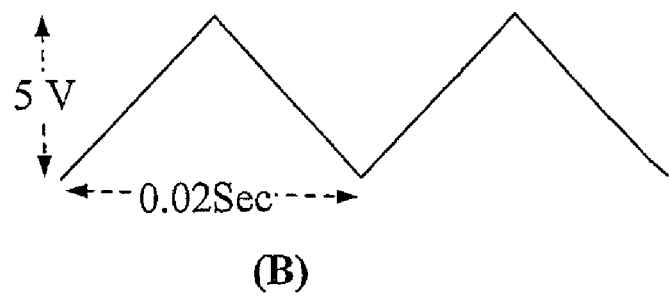
(B)
Fig 10: (A) X deflection signals. (B) Y deflection signal.

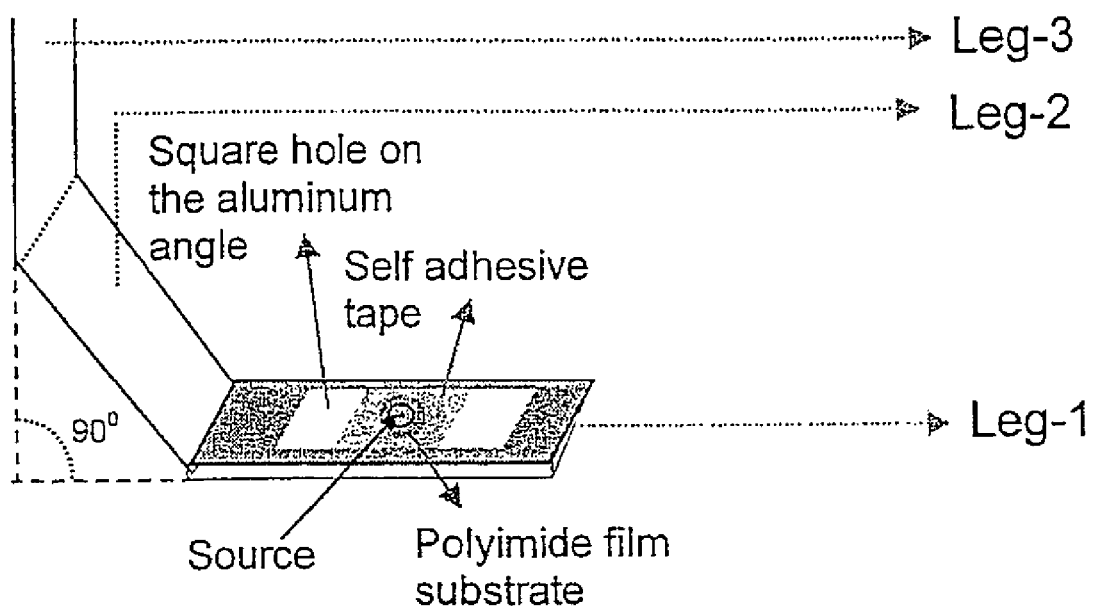
Fig 11 : Top view of the sample holder

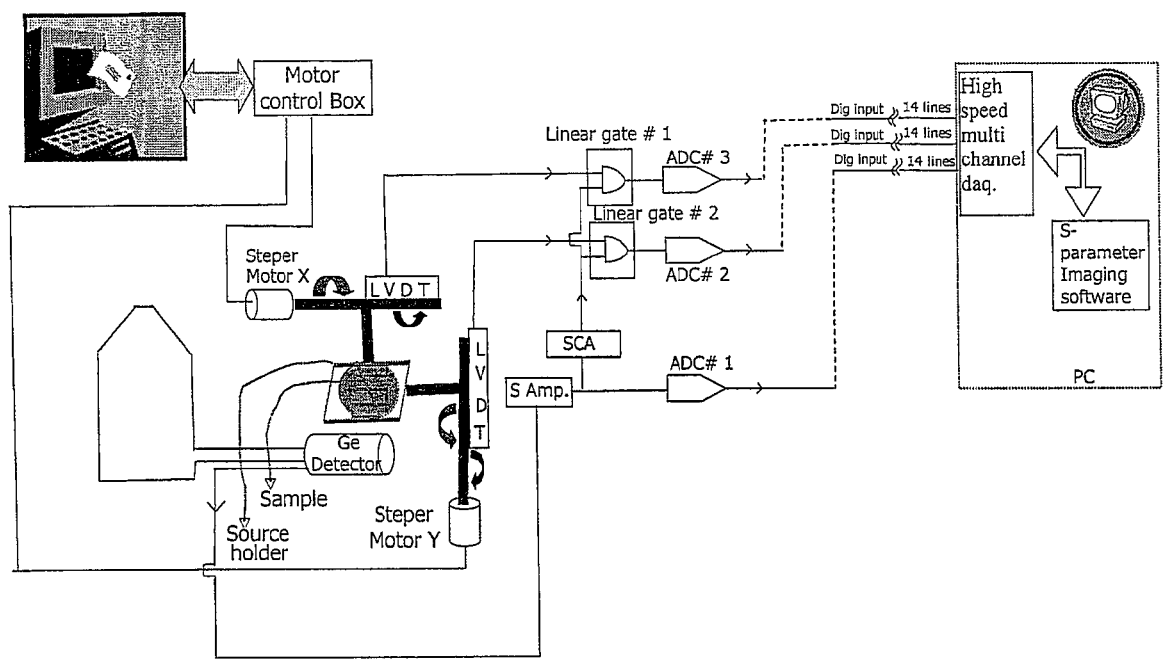
Fig12 : Complete scheme of the basic imager.

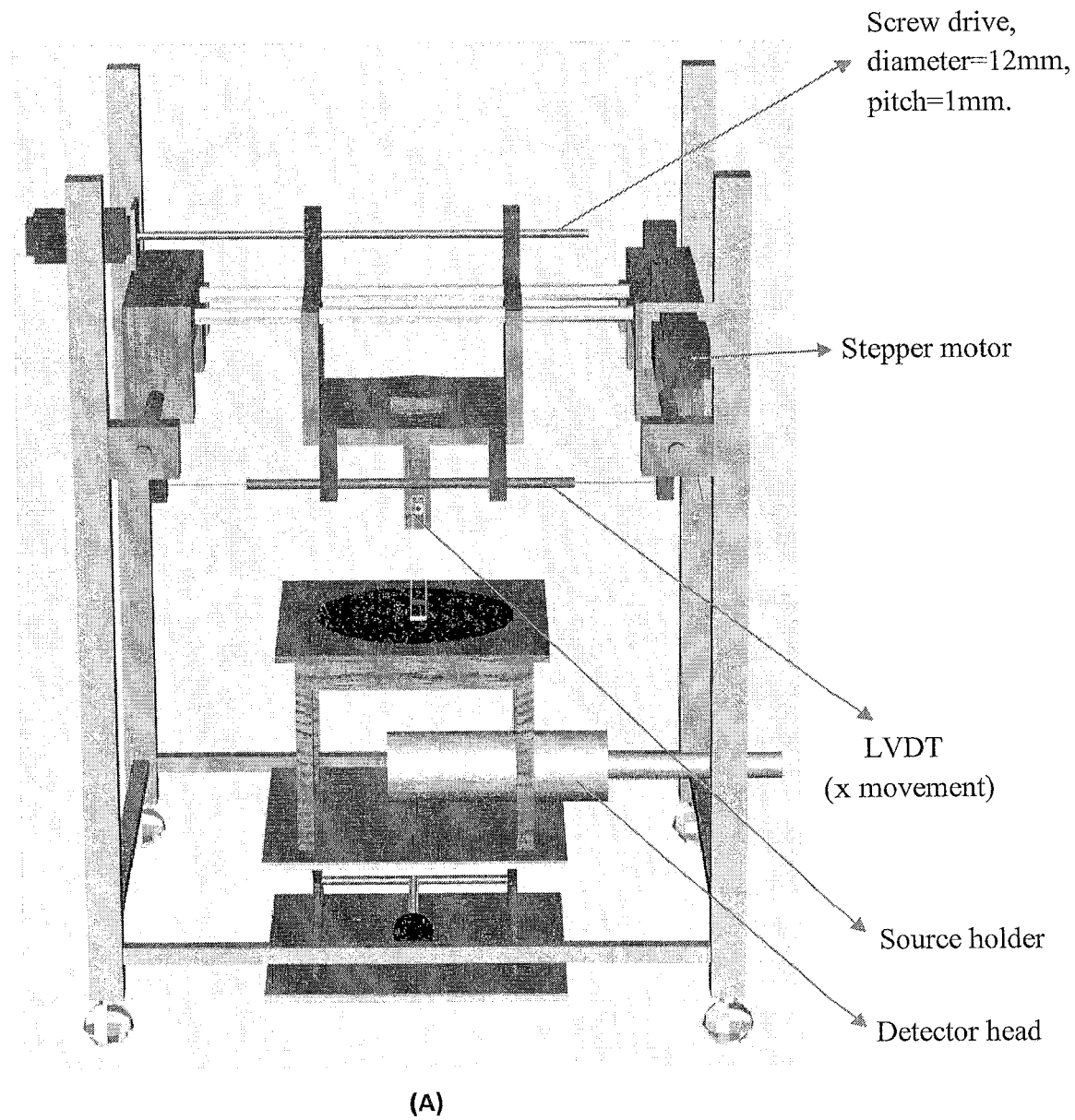
Fig-13 : Scanning apparatus : Side view.

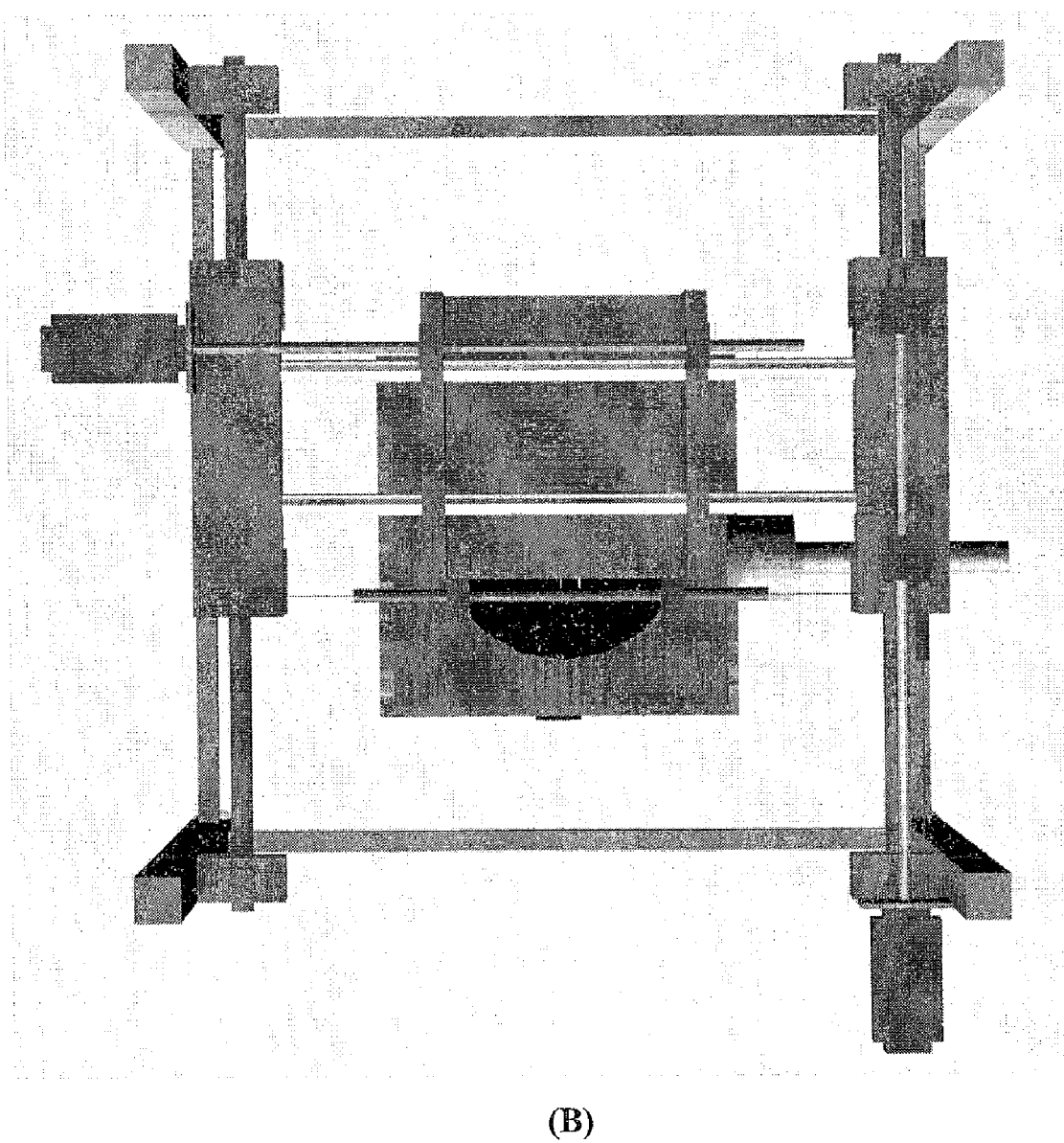
(B)
Fig-13 : Scanning apparatus : Top view.

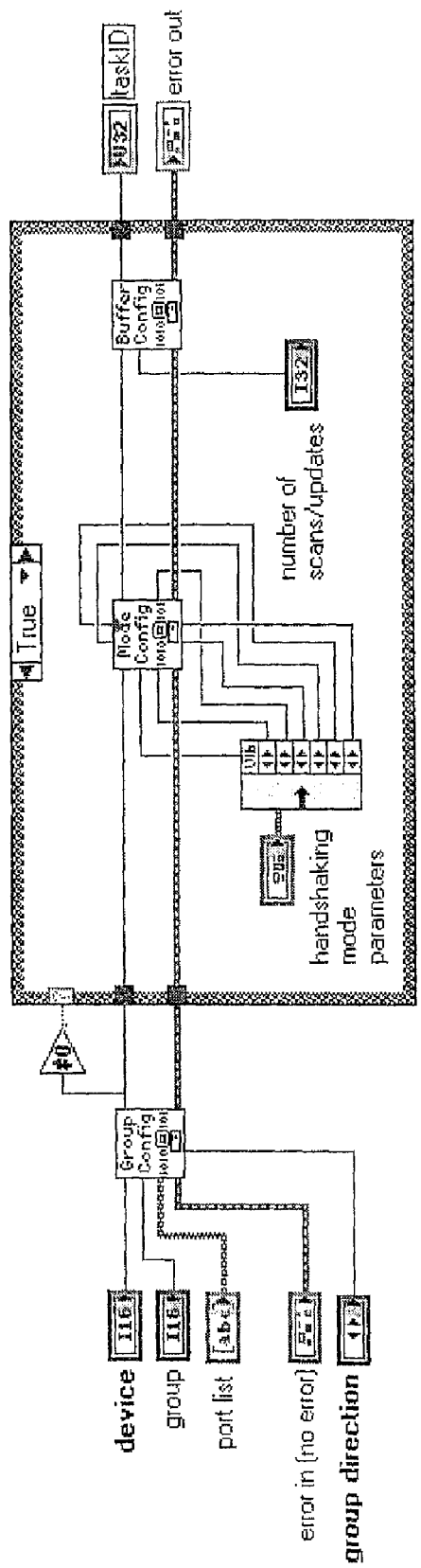
Fig. 14A : VI diagram of DIO CONFIG.vi

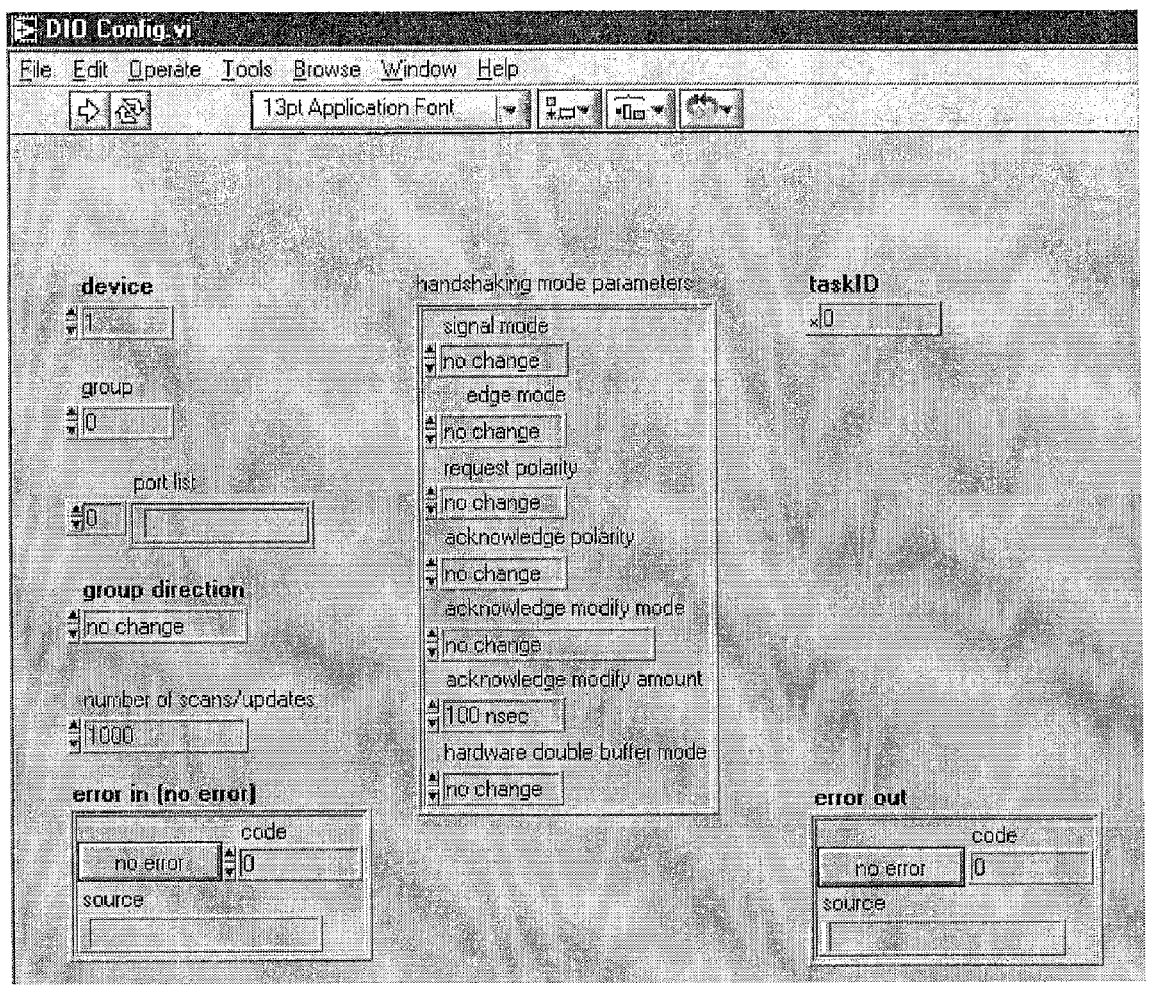
Fig- 14B : Front panel of DIO CONFIG.vi

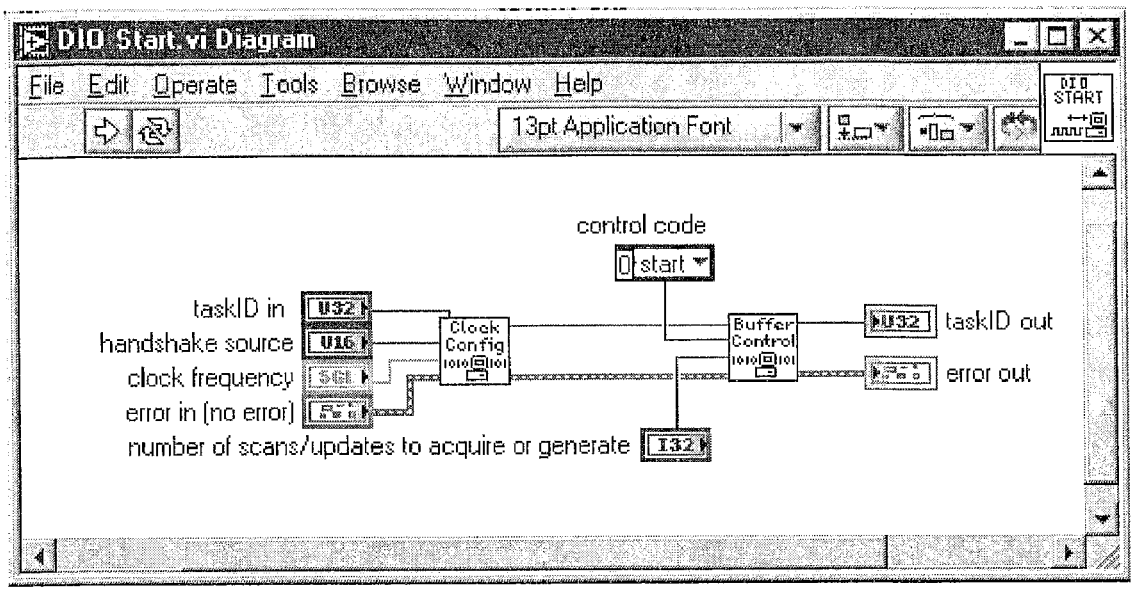
(A)
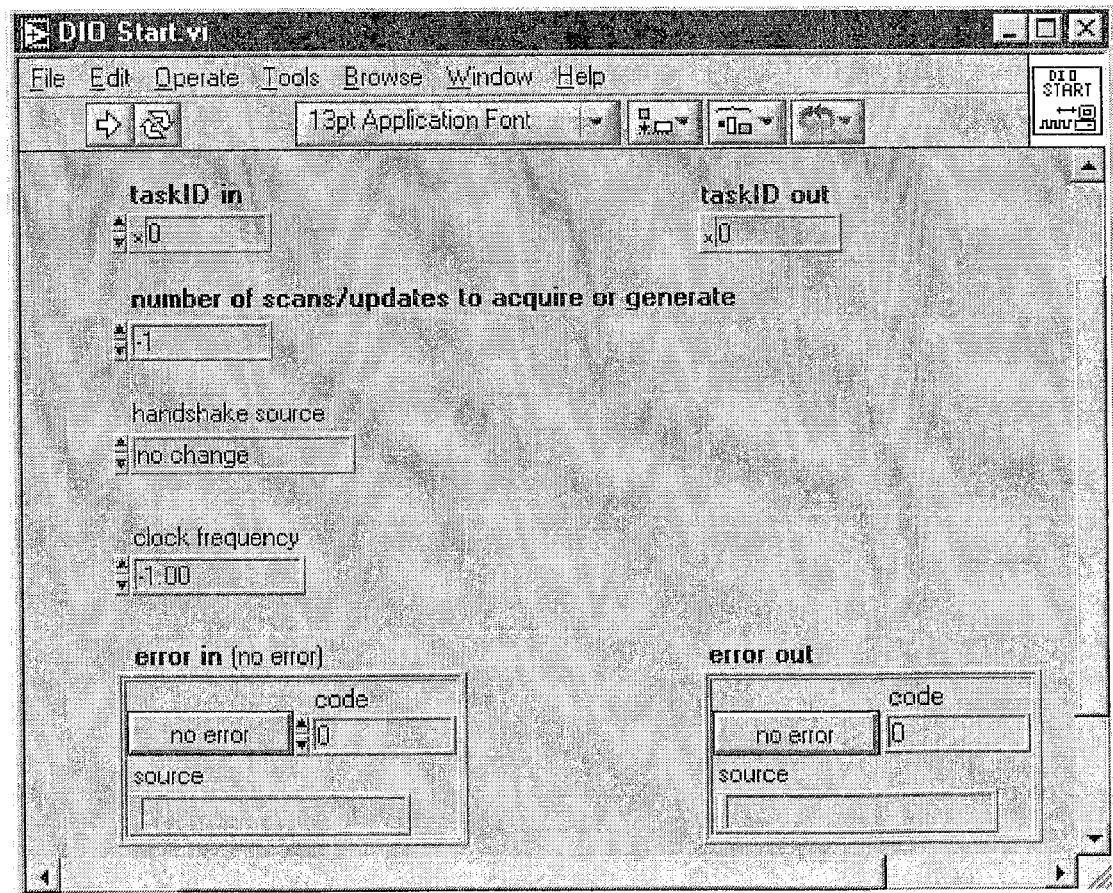
(B)
Fig-15 : DIO START.vi, (A) VI diagram (B) Front Panel.

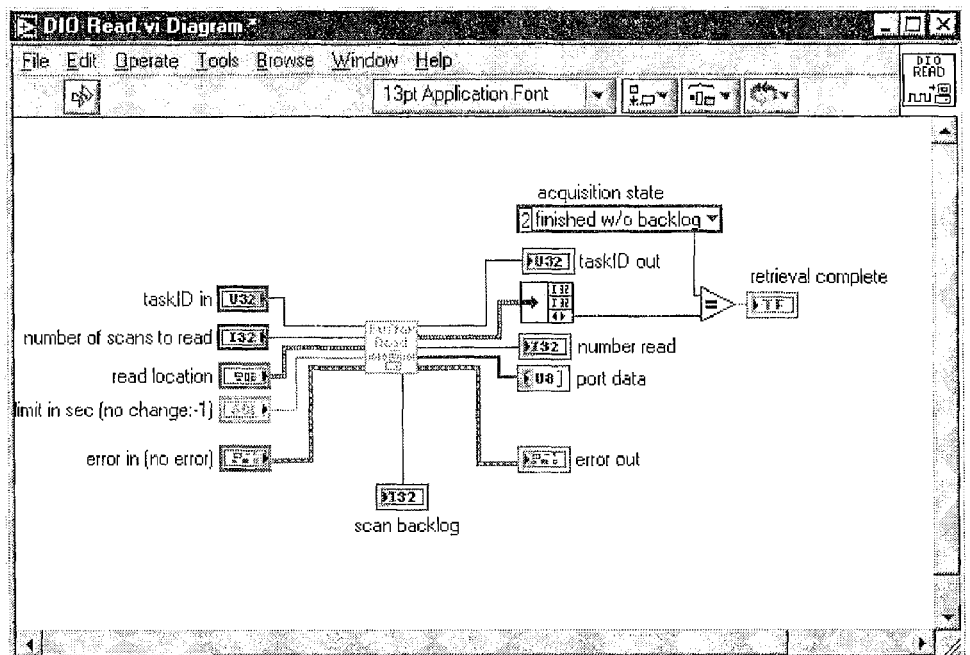
(A)
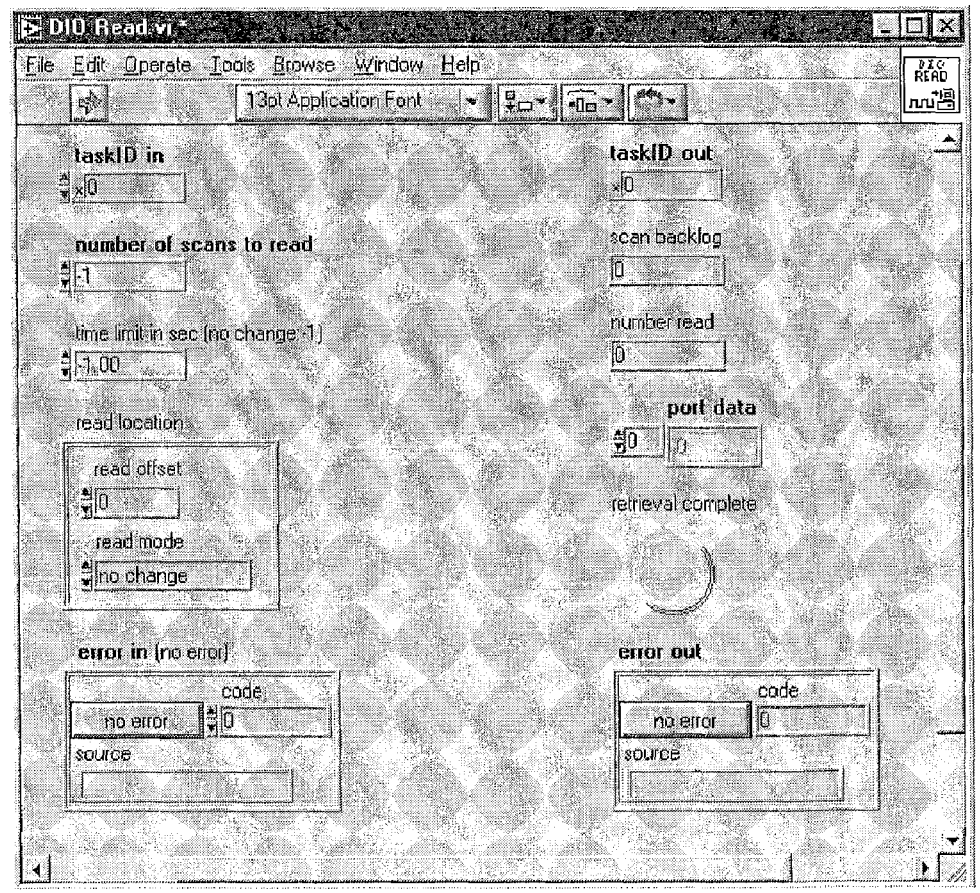
(B)
Fig-16 : DIO READ.vi, (A) VI diagram (B) Front Panel.

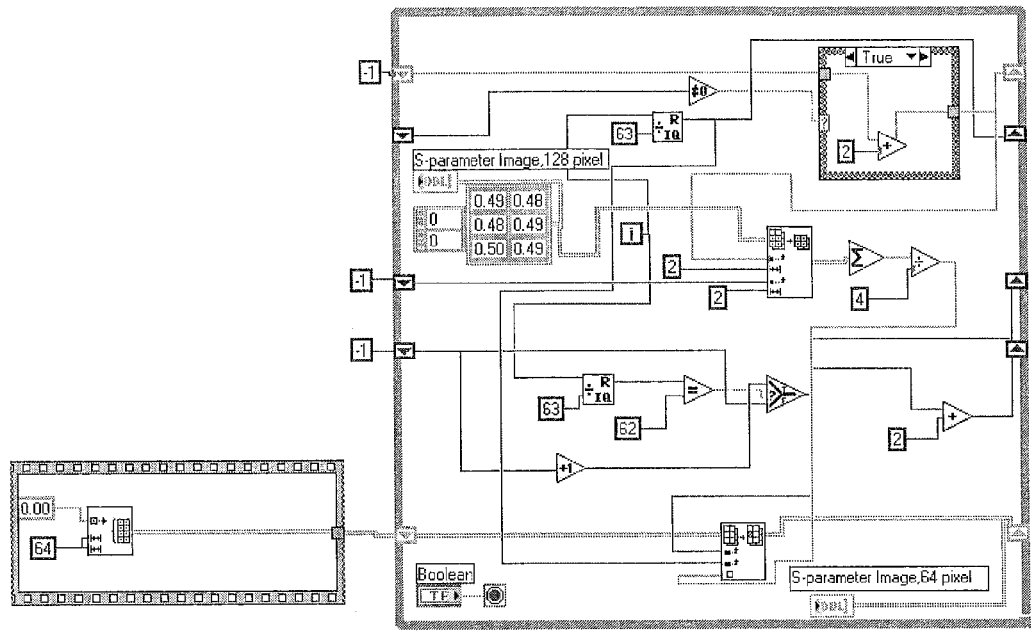
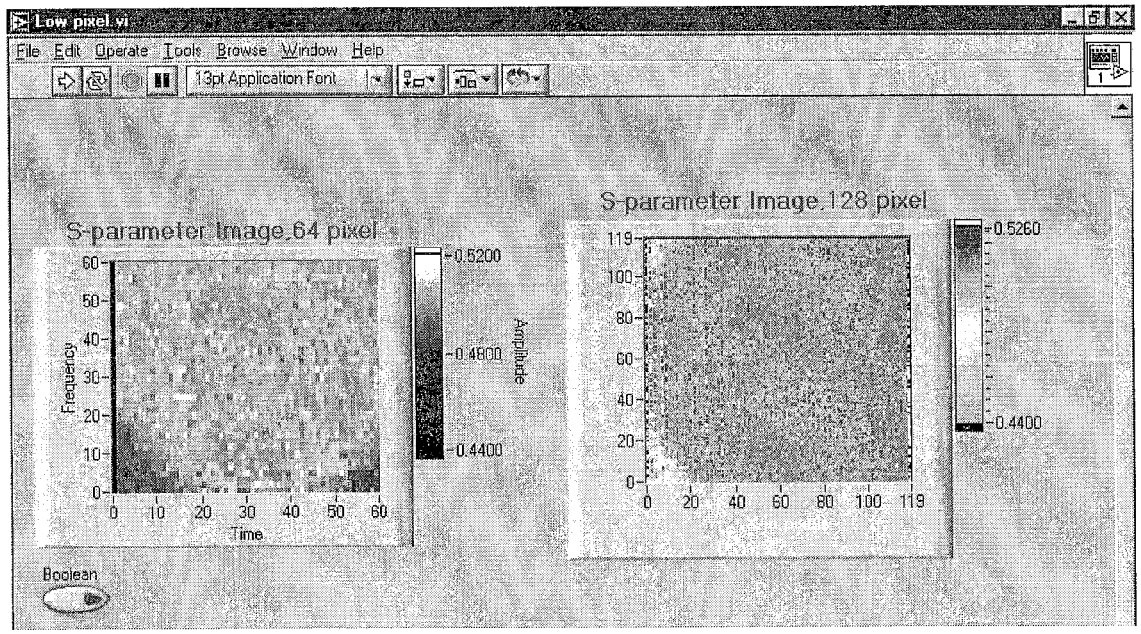
Fig – 17 : High pixel to low pixel conversion sub-vi (A) VI diagram (B) frontpanel.

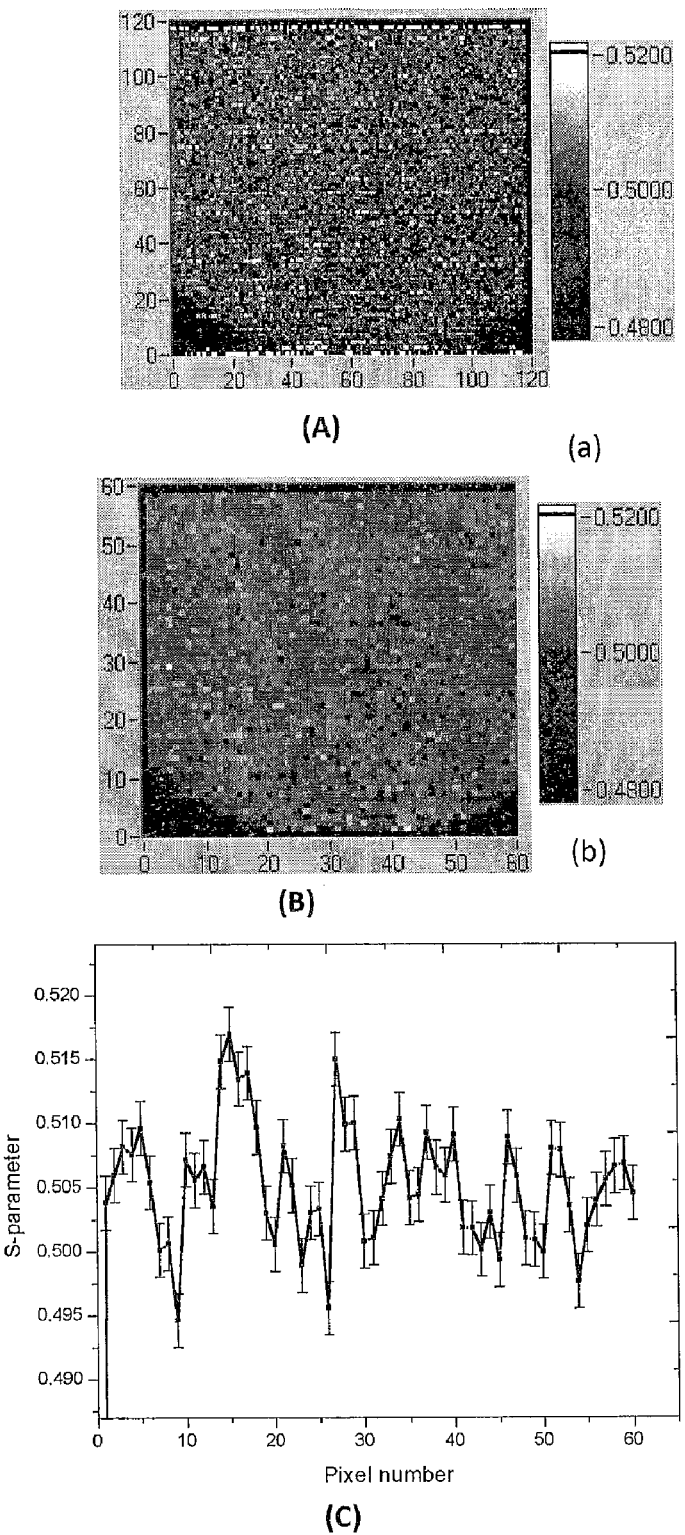
Figure 18 : (A) & (B) S-parameter images of GaAs wafer of size 3mmx3mm in. Image is 128x128 and 64x64 pixels resolution respectively with stepper motor step width 3.6 degrees. (C) S-parameter values plotted against the corresponding pixel number along row 29 of Fig 18B

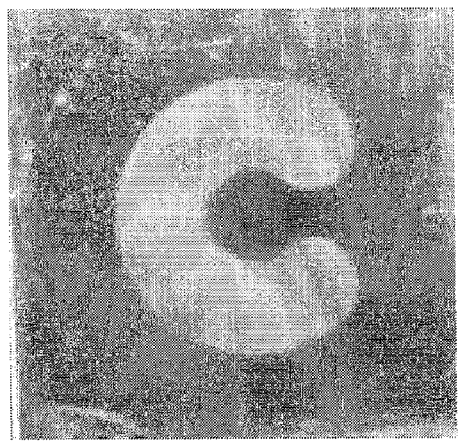 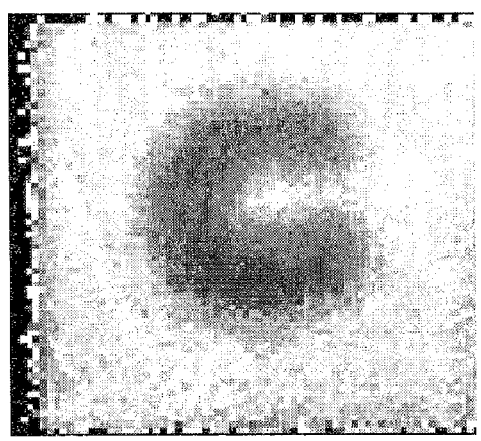
(A) (B)
Fig. 19: (A) Photograph of a thin film sample; (B) S-parameter image with a slow positron beam.

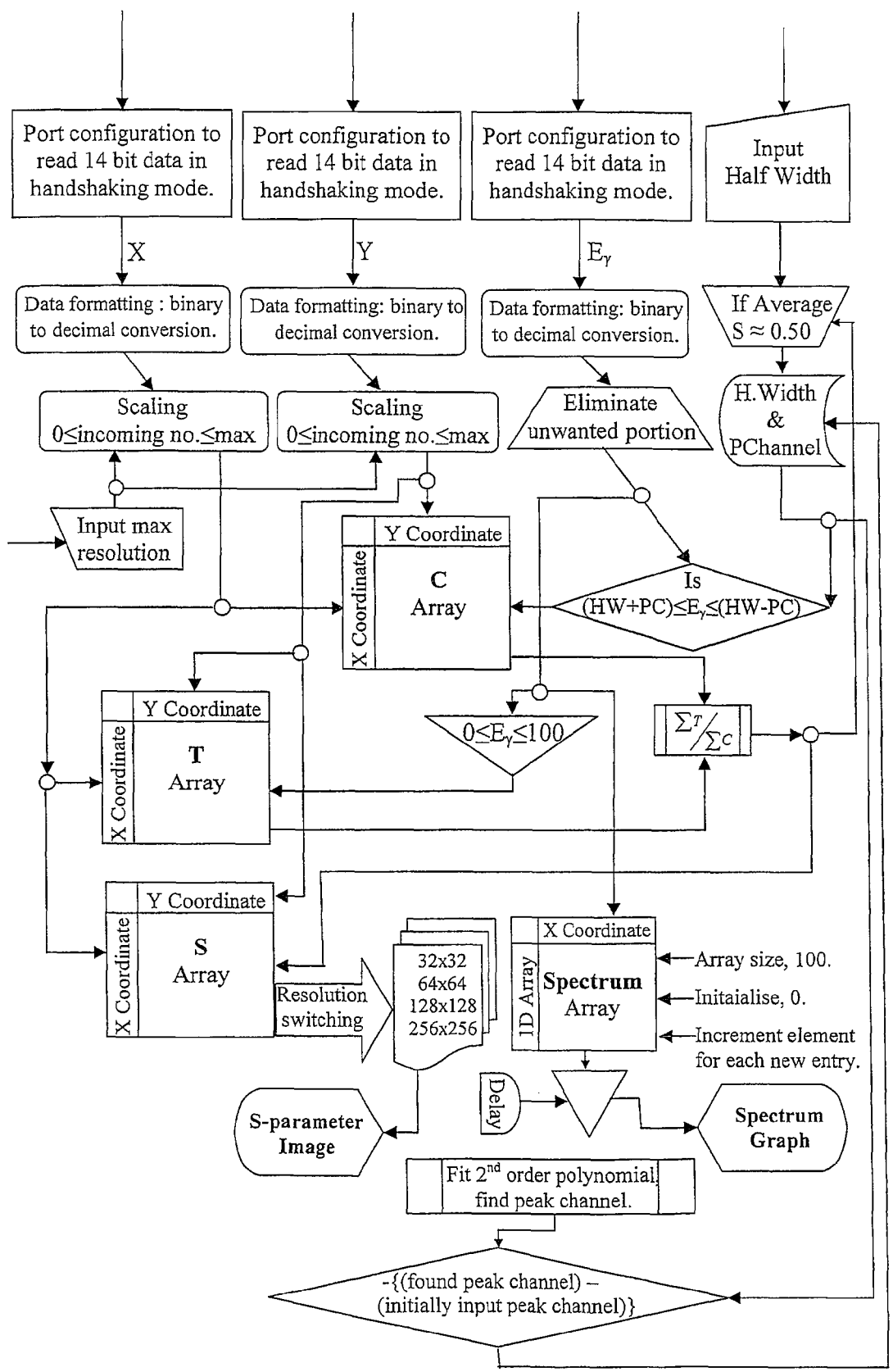
Fig. 20 : The System software : a flow chart representation.

REAL-TIME S-PARAMETER IMAGER

CROSS REFERENCE TO RELATED APPLICATIONS

This application is a continuation of U.S. patent application Ser. No. 11/797,621, filed May 4, 2007, now U.S. Pat. No. 7,781,732, which is a divisional of U.S. patent application Ser. No. 10/890,723, filed Jul. 14, 2004, now U.S. Pat. No. 7,420,166, the entire contents of which are incorporated herein by reference.

BACKGROUND OF THE INVENTION

1. Field of the Invention

The present invention relates to digital imaging, and more specifically, creating high-quality S-parameter images in real-time.

2. Background

Positrons are known for their sensitivity to vacancy type defects in solids. Using Doppler broadening spectroscopy, the shape of the 511 keV annihilation line, as represented through the S-parameter, provides a helpful measure of neutral and negatively charged vacancy defects. S-parameter imaging of a wafer surface by laterally scanning a point source of positrons across the wafer surface can provide useful information regarding the density of bulk defects in the wafer. Such scans have been made in the past by moving a radioactive source or a positron beam across a wafer. In this method, the beam or radioactive source is kept fixed and one point on the sample is exposed to that radiation for some fixed time and all annihilation events are then recorded for that point before moving on to the next point. The next point is then exposed to the positron radiation and so on until the whole sample surface has been scanned. The whole data set is finally processed off-line as per the requirement and is finally plotted in the form of an S-parameter graph using plotting software.

BRIEF SUMMARY OF THE INVENTION

There are at least four major draw backs of the standard imaging method. The first drawback is that the image can only be visualized after the completion of the entire surface scanning, which takes typically a few days for storing sufficient information to produce a good quality image. Using this method it is quite possible to collect data for a longer than necessary period if the S-parameter features of the sample turn out to have good S-parameter contrast. In some cases of prominent defect profile, even with less data at each pixel point it may still be possible to make a nice inference.

The second drawback is that analyzing the image with any graphing software is always static. In such a system, one cannot dynamically interact with the visualization process.

Third, there is no global monitoring of the image during the data taking process. For example, the right justification of the sample with respect to the scanning source/beam may be in error. Such an error can only be picked up after a completed sequential rectilinear scan had been made. Thus, much time can be wasted in improper positioning of the sample.

Finally, even those research groups having a positron beam are restrained to moving the sample using a mechanical system. This means that there will always be a possibility of some mechanical backlash.

In contrast, the present system works preferably by parallel rapid and continuous rastering of the whole sample surface, with information at each pixel location being built up at the same time. Alternatively, sequential point-by-point accumulation of data is used. The present system is supported by imaging software that allows the user to monitor the image build-up online in a dynamic and interactive mode that facilitates the formation of a good quality image of the sample in the shortest possible time. This system is useable with a $^{22}$Na source as well as a sub-millimeter diameter positron beam. The imager system has many more features that will be discussed below.

Disclosed is a real-time automated imaging system for solid state technologists that permits the location of subsurface defects on any material sample by simply monitoring its positron image. This S-parameter imaging technology employs a technique for scanning the sample surface in 'parallel-rapid rastering' mode. The electronic setup for signaling and data processing utilizes nuclear instrumentation modules in such a way so as to optimize the accuracy, precision and efficiency of data collection. Further, according to one embodiment, the data acquisition and image processing is performed in real time. This technology has been developed for two major categories of researchers, those that have a focused low energy positron beam and those that do not. With this S-parameter imager, all the drawbacks of the existing techniques discussed above have been overcome.

The major advantages may briefly be listed as: (i) the rapid and repetitive scanning of different points of the sample one after another for the whole surface; (ii) the data is processed in real time with concurrent on-line image construction; (iii) image features can be seen quickly; (iv) electromagnetic deflection of the positron beam permits fast rastering for more advantageous configuration of a fixed sample; (v) electromagnetic deflection of the positron beam eliminates possible backlash of a moving sample stage; (vi) the imaging software permits the user to monitor various important hardware functions so as to check on the primary data fidelity and to permit necessary adjustments as required; (vii) the software is interactive and user friendly; (viii) the software gives the freedom to the user to monitor all setups and image quality; (ix) the user can continue to scan the sample until satisfied with the image quality; (x) optimal resolution which is a big factor in image analysis is also taken care of.

BRIEF DESCRIPTION OF DRAWING

FIG. 1A is a layout of a source and scanning setup together with wafer and detector: side view.

FIG. 1B is a top view of the source and scanning setup together with wafer and detector showing motion of the source.

FIG. 2 is a block diagram showing one embodiment of the Electronics setup of the Imager.

FIG. 3 is a 'virtual instrument diagram/program' depicting the system software written in LabVIEW, a graphical programming language.

FIG. 4 is a depiction of a Front Panel of the program given in FIG. 3.

FIG. 5 is a side view of the XY deflection coils.

FIG. 6 is a cross-sectional view of the XY steering coils.

FIG. 7 is a block diagram of one embodiment of the imager as applied to the low energy positron beam.

FIG. 8A is a photograph of e$^+$ symbol made up of 0.5 mm thick kapton foil and pasted on the surface of silicon wafer.

FIG. 8B is an S-parameter image of the kapton e$^+$ symbol depicted in FIG. 8A.

FIG. 9A is a photograph of monocrystalline Ni sample.

FIG. 9B is an S-parameter image of the sample described in FIG. 9A.

FIG. 9C is a bar-chart plotting of the S-parameter value versus the pixel number with the data values taken along row 55 from FIG. 9B.

FIG. 10A represents an X deflection signal for the beam application according to one embodiment of the disclosed device.

FIG. 10B represents a Y deflection signal for the beam application according to one embodiment of the disclosed device.

FIG. 11 represents one embodiment of a sample holder.

FIG. 12 is a block diagram of the imager setup.

FIG. 13A is a side view of the scanning apparatus.

FIG. 13B is a top view of the scanning apparatus.

FIG. 14A is a LabVIEW VI diagram for the library available sub-vi, DIO CONFIG.vi.

FIG. 14B is a LabVIEW VI front panel for the VI given in FIG. 14A.

FIG. 15A is a LabVIEW VI diagram for the library available sub-vi, DIO START.vi.

FIG. 15B is a LabVIEW VI front panel for the VI given in FIG. 15A.

FIG. 16A is a LabVIEW VI diagram for the library available sub-vi, DIO READ.vi.

FIG. 16B is a LabVIEW VI front panel for the VI given in FIG. 16A.

FIG. 17A is a LabVIEW VI diagram for high resolution (pixel) to low resolution image conversion sub-VI.

FIG. 17B is a LabVIEW front panel for the VI given in FIG. 17A.

FIG. 18 (A) is an S-parameter image of GaAs wafer size 3 cm×3 cm. The image resolution is 128×128 pixels taken with stepper motor step width 3.6 degrees. (B) S-parameter image of GaAs wafer of size 3 cm×3 cm. Image resolution is 64×64 pixels and image is taken with stepper motor step width 3.6 degrees. (C) S-parameter values plotted against the corresponding pixel number in row 29 of FIG. 18b.

FIG. 19A is the figure 'C' is a 0.4 μm Al thin film deposited upon a Cu substrate.

FIG. 19B is an S-parameter image (of the figure C described in FIG. 19A), imaged with a slow positron beam of spot diameter 1.5 mm.

FIG. 20 is the flow chat of the complete system software.

DETAILED DESCRIPTION

A positron scanning setup shown in FIG. 1 comprises a positron source fixed to a holder arm that uses a rastering action across a sample. The resulting annihilation photons are detected by a detector. In one embodiment, the positron source comprises a $^{22}$Na source encapsulated in a Kapton foil. The source has a strength of approximately μCi and preferably a diameter of about 0.5 mm. In one embodiment, the source holder angle is approximately 60 degrees from the sample's normal so as to avoid any possible walling above the source where the positrons might be reflected back towards the sample or annihilate in any material other than that of the sample.

In a first embodiment, the holder has a square hole, while in other embodiments the hole can be rectangular, oval, round, etc. There is a thin plastic film/self adhesive tape/cello-tape fixed across the bottom part of the hole in angle holder, as shown in FIG. 11. Preferably, the self adhesive tape has a 1 cm diameter hole.

As discussed above, the source is encapsulated in a kapton foil. The kapton piece is fixed below the self adhesive tape, on the paste side, so the source (black spot) is kept at approximately the center of the hole in the self adhesive tape. In one embodiment, the source is fixed around the center of the hole in the self adhesive tape and fixed to the holder such that its bottom part is free of any obstruction while not hindering the downward moving positrons. Also, the hole gives freedom to all upward moving positrons to disperse and annihilate at some distance from the detector, rather than being scattered/reflected towards the sample. Preferably, the source moves to about 0.5 mm above the sample surface to avoid spreading of the positrons. A high purity germanium (HP Ge) detector is attached at an adjustable distance (typically 5 cm) below the sample in accordance with required data rates. The distance is measured between the sample surface and the axis of the cylindrical detector head. In another embodiment, the sample and the detector are kept firmly fixed in their relative positions.

Raster scanning of the source is accomplished by driving a dual stepper motor system controlled by software. While the software may be written in Visual Basic, other languages or other object oriented languages can be used.

The system preferably has a resolution of 0.9 degrees in each step and 400 steps per second on a screw drive channel rail with diameter 1.24 cm. [pitch=1 mm, diameter=12 mm].

The electronics used for signal processing comprises a spectroscopy amplifier, Single Channel Analyzer (SCA), linear gates, and LVDTS. The spectroscopy amplifier is selected to filter the charge integrated pulse outputted from the detector's preamplifier. The (SCA) provides a TTL logic pulses every time a peak amplitude voltage pulse from the spectroscopy amplifier falls within a narrow band of voltages (energy window) that signify a 511 keV (annihilation event) gamma ray energy event. In one embodiment, two linear gates are switched every time a TTL "high" is supplied from the (SCA) so as to produce the position coordinate signals x and y that have pulse heights proportional to the x and y displacements. This allows for efficient management of processing time and memory by providing x and y coordinate information when an annihilation event triggers the (SCA)/detector system. When an annihilation event triggers the detection system, recalculation of the S-parameter occurs for the pixel that has received an event, since if there is no event, nothing is contributed towards the S-parameter value of that concerned coordinate. In one embodiment, the instrumentation setup includes linear variable differential transformers attached to the scanning instrument as shown in FIG. 13, such that for the whole range of movement, they operates with a positive output as required to produce positive x and y pulses for the nuclear ADC. The LVDTs are preferably calibrated in the range, +5 volts with resolution 0.001V. The scanning apparatus shown in FIG. 13 comprises a rigid iron frame structure on which the stepper motors that drive the scanning in the xy plane through screw channel rails are mounted. While the system was discussed using TTL logic, the system can be implemented using CMOS logic, ECL logic, or the like.

The scanning apparatus comprises two stepper motors which are controlled by a computer running the motion control software program. In one embodiment the program is written in Visual Basic. Other programs can be used including Delphi, C++, Java, etc. The motion control program is typically run in the environment of the motor control software that is provided by the manufacturer of the motor.

FIG. 20 depicts the imaging software in flow chart form. FIG. 3 is a depiction of the system software program written in LabVIEW (LabView is a graphical programming language software. In LabVIEW terminology, such a graphical program is called as 'virtual instrument diagram') The instrumentation comprises data acquisition, data processing, computations, and real-time image visualization. The software algorithm accesses binary data from three different nuclear ADCs employed for x, y and energy channels and then converts the 14 bit data blocks (as the ADC output is 14 bit binary) into integer decimal numbers.

In one embodiment, the program is adapted to accommodate the x and y coordinate data in a 32×32, 64×64, 128×128, or 256×256 matrix. The matrix is transformed into coordinate pixels in the graphing plane. By default, the system stores data in a 128×128 matrix. But the user may also choose it to 256×256, 64×64 and 32×32 by adjusting the rotatable knob named "max resolution" on the front panel (FIG. 4). An algorithm in sub-vi form in the imager checks lower pixel images converted from the higher pixel original image (pixels chosen by the user in "Max Resolution") acquisition which is a state of continuing acquisition (FIGS. 17a and 17b are the VI and front panel of this sub-vi).

The program preferably includes a scaling algorithm using simple digital-offset. By dividing the remaining value with a fixed number, which is determined according to the maximum and minimum x and y channels present in the incoming numbers from the front panel shown in FIG. 4, so that the input x and y coordinate values range from 0 to the user input resolution value for correct indexing to the corresponding data storage matrix. Included in the program is a provision to monitor the incoming energy value as shown in the front panel, Energy Channel window in FIG. 4 from which the user can select maximum energy value.

The program also monitors the energy spectrum in a xy plot having y axis as the total sum of all energy values stored for a particular x and y index and the subsequent pixels, in Physics term, channel no, in the same row of the matrix. The energy spectrum is plotted giving a very efficient way to monitor the electronic drift during the period of image acquisition or a portion thereof. The program includes a provision for the user to input a numbered which will be deducted, a digital offset, from each of the incoming energy values. This deduction is to keep only 100 channels around the peak channel (the maximum energy value) for processing. This input number is inputted by monitoring the energy spectrum on the front panel as shown in FIG. 4.

Additionally, a half width value having a decimal value having 3 digits after the decimal point can be entered as shown in the front panel FIG. 4. The number is selected to preferably keep the "Mean S" value very close to 0.500 (front panel, FIG. 4) which is the optimum for S-parameter sensitivity. The peak channel is measured using the energy spectrum graph as displayed on the front panel, as shown in FIG. 4. This value is determined by an automatic peak finding method involving fitting a $2^{nd}$ order polynomial to the top 25% of the spectral height. The user inputs the half width value that is used to compute the S-parameter, and, after a few trials, achieves a value that produces an S-parameter of around 0.500. Once the half width value is fixed, the peak position is checked (by $2^{nd}$ order polynomial fitting) in a certain time interval (user optional between 1-10 minutes) to monitor the electronic drift and an automatic feedback loop ensures that the central region is kept locked on to the peak center.

This minimizes computational time as well as the memory occupancy as there is no excessive real-time computational procedure. The S-parameter is computed in real time in optimal system time consumption and the optimal memory occupancy. The S-parameter is computed by taking the sum of all energy events coming in the range of the peak channel+half width and the peak channel—half width to the sum of all energy events coming in the window of 100 channels around the peak channel, i.e., peak channel −50 to peak channel +50.

The optimization of the system is accomplished by keeping control over the image refreshment period ('Image Refresh' window, front panel, FIG. 4) so that the user can input the refreshment period by inputting an integer number which is taken as milliseconds. Refreshing 10 times in a second is almost like real time refreshment as the human eye cannot detect changes at a much faster rate. In other embodiments, the refresh rate is set automatically. The S-parameter image (S-parameter Image window, FIG. 4) is plotted in an intensity plot such that the length and breadth of the sample are plotted in x and y axis respectively and the S-parameter value is taken in the third dimension and such that a color scale corresponds to the S-parameter value.

The real-time visualization of the S-parameter image, the resolution of which depends upon the matrix size (number of pixels) which is assigned for the data storage in order to get the various pixels of the image. Additionally, the real-time visualization of the S-parameter image with the resolution of this image depending upon the step width of the stepper motors employed for the x, y motion with less step width giving better resolution.

In yet another embodiment, the real-time visualization of the S-parameter image where the time required to get a decent image depends upon the rate of annihilation events detected by the detector and then transferred to the imaging software with higher event/data rates providing faster image production. A diagnostic rate-meter tool (FIG. 4) is provided which shows the average rate of incoming annihilation event data in the range of 100 channels around the peak channel. The monitoring of which gives an estimate of the efficiency by which events detected by the detector are being successfully transferred in to the imaging software.

With use of the instrumentation technique, as depicted in FIG. 7, the system can also take an image using a monoenergetic positron beam (it means a particular energy setting for positrons in case of variable energy beam) substituting the $^{22}$Na source. As shown in FIG. 7, the instrumentation technique comprises x and y deflection coils coupled to signal generators that provide suitable ramp voltages to the x and y deflection coils. The charged particle beam can be deflected electromagnetically so as to raster the positron beam across a specified area of the sample.

The x and y coil pairs which are wound with 22 gauge wire are shown in FIG. 5 and FIG. 6 on a proper frame in the appropriate shape. It should be noted that shape and dimensions depend upon the beam design structure of the user with the coils being made firm with application of some glue and then being mounted to the beam structure with suitable support.

The xy coils are calculated to meet the current supply capacity to produce the necessary deflection magnetic field strength, a calculation which can easily be done using Ampere's current law or the Biot-Savart's law. The x and y signals which are respectively a uniform triangular wave (frequency=50 Hz, Amplitude=5V) and a saw-tooth ramp voltage (frequency=1 Hz, Amplitude=5V). The x and y signals which are current amplified up to a suitable level as necessary for the deflection magnetic field necessities which can easily be calculated with help of Ampere's current law.

A first embodiment of the disclosed S-parameter imaging system consists of three major sections, namely the $^{22}$Na source scanning apparatus, the pulse processing electronic setup, and the dedicated system software. The imager system is developed using a radio active positron source which is a focused low energy positron beam. The basic imager is described as well as the positron beam application.

The sources and scanning apparatus are shown in FIG. 1. In one embodiment, the source is comprised of a 0.5 mm diameter 5 μCi $^{22}$Na encapsulated in 8 μm thick Kapton foil. The source is supported by a thin plastic sheet attached to an aluminum support frame. The aluminum support frame is connected to an X-Y stepper motor drive. The source is suspended 0.5 mm above the wafer surface. Other types of source designs, such as ones involving collimation of positrons by Al or heavier materials that may allow some screening of annihilations coming directly from the source material itself or a source with no backing material and no collimation. Positrons ejected in the direction opposite that of the wafer traveled tens of cm in the air and the fraction of annihilations received from such positrons was thus minimized through the inverse square law. During the scanning motion the distance from the source to the center of the detector varies between 5 and 6 cm causing slight variations of count rate which have no significant effect on the detector's energy resolution.

The source is moved in rectilinear motion (see FIG. 1) by stepper motors which operate linear screw drives. The stepper motor drives are controlled by an independent computer. Linear Variable Differential Transformers (LVDTs) are attached to the base of the support frame so as to provide voltages proportional to both x and y motions.

Annihilation photons, predominantly from the wafer, are detected using an HP Ge detector. Preferably, the detector has a 20% efficiency. The data rate into the annihilation line is preferably limited to 1,500 positron annihilation events per second after optimizing the detector to source distance. Components for one embodiment are shown in Table 1

FIG. 2 depicts a block diagram of one embodiment of the electronic instrumentation. As the positron source rasters across the wafer surface, the x and y LVDTs provide DC voltages proportional to the displacement in these direction directions. These voltages are converted to pulses of 2 μs width using two linear gates that are fed from a Timing Single Channel Analyzers (SCA) output, which in turn is derived from annihilation photons that give energy signals in a narrow window around 511 keV. It should be noted that every energy event within the defined window there is an associated x and y pulse, the amplitude of which gives the position of the source at the time of the event. The annihilation photon energies E.sub..gamma. together with the x and y pulse signals are processed using a 14 bit nuclear ADC, a peak search and hold ADC. Here the use of the TSCA and the Spectroscopy Amplifier (S.Amp) are as per the standard nuclear instrumentation setup.

Using event data triplets (x, y, $E_\gamma$) an S-parameter is computed in real time for each pixel region and is used it to refresh a color image display on the screen coordinates. The program is written using LabVIEW 6.1. FIG. 3 shows the virtual instrument (VI) diagram that depicts the block diagram program of the whole software part of the system. This VI consists also of some sub VIs that are available in the library of the LabVIEW software. DIO CONFIG.vi, DIO START.vi and DIO READ.vi are the library subVIs used here for digital input port configuration, timing of data sampling and data reading respectively. FIGS. 14a&14b, 15a&15b and 16a&16b show the detailed virtual instrumentation diagrams and front panels with typical parameter sets respectively for the above said subVIs. Three identical modules are employed to read 14 bit binary data from the x, y & E (energy) channels. From the output of the subVI DIO READ, the 14 bit binary stream is then passed through further processing in order to convert it into numbers as shown in FIG. 3. The x and y voltage pulses (spanning 0-5V) are digitized into a 8 k number while the E voltage (0-10V) is digitized into a 16 k number. The numbers from these three different ports are scaled, manipulated, processed and finally traced out into the S-parameter image.

After scaling the three primary inputs (x, y, and E), the data is stored in two 2-dimensional arrays. The first is referred to as the C array and counts events that have fallen in the center region (defined by the control "half-width" in FIG. 4) of the annihilation peak. The second is the T array which counts all annihilation events irrespective of where in the annihilation peak they fall. Each event is indexed into the appropriate element of the array according to the value of x and y for the event. The final stage is computing the S parameter for each array element. With reference to the FIG. 3, the computational strategy for real-time determination of S-parameter is preferably optimized in time and memory consumption. The scheme of S-parameter computation is made as practicable as possible by considering the empirical values, unlike the traditional method in which S is calculated in an extremely bulky data handling and computational procedures involving background reduction, peak fitting (i.e., spine or polynomial fitting) in real-time. In practical observation, these extremely heavy computational expenses do not give any noticeably improved sensitivity with regards to minute inference of defect characteristic in image analysis to make them warranted. In contrast, the S-parameter is simply obtained by dividing the sum of events in the central region "C" by the total sum of events "T" coming in the specified 100 channels, for all array elements (S=C/T by definition). This array of S-parameters is stored and forms the S-parameter image.

The imaging software has an embedded important facility that allows variable lateral resolution of the image. There are 4 different resolution levels, namely 32×32, 64×64, 128×128 and 256×256. These are useful in that it takes time for S-parameter information to build up in the image. The accuracy of the S-parameter in each pixel depends on the square root of the number of events for the pixel (or the square root of the amount of accumulation time). For this reason, the user may choose to start the imager with a 32×32 resolution and increase this to 128×128 as time goes on. Indeed sufficiently good images may be achieved, according to user requirement, for example with 64×64 resolution. The number of pixels in the plot is a user defined option. FIG. 4 shows the control panel in which the rotatable knob "Max Resolution" serves the purpose of resolution variation. The changing of resolution is accomplished using an algorithm in sub-vi form to check the lower resolution image converted from the higher resolution image (128×128) acquisition which is continually accumulating (FIGS. 17a and 17b are the VI and front panel of this sub-vi). In FIG. 3, it is seen that x and y incoming values serve the x and y indices in order to accommodate the incoming parameter value in the 2D array mapping. Preferably, the minimum and maximum values of the incoming x and y values should range from about 0 to about 128. To achieve this, the x and y digitized voltage values from the LVDTs undergo both a digital offset and scaling. This may be seen from the front panel (FIG. 4), where the maximum and minimum incoming values of the x and y ports are noted and the difference of the respective max and min values is divided so as to produce natural numbers up to about 128 after being rounded off. There is preferably no scaling for the energy values, but much of the data is discarded since it does not form part of the annihilation line. Thus only those digitized energy values that lie within about ±50 of the annihilation peak maximum or peak channel are used for the S-parameter calculation. The shape of the annihilation line 'spectrum' can be viewed from the front panel (FIG. 4), a suitable number being manually entered by the user so as to keep only those 100 channels around the peak value which will give rise to the average S-parameter value approximately 0.500 in view. Also only the positive energy values are being chosen. The user has to enter the value of the 'half width' (of the 511 Kev event) in the specified field (6 digit decimal) of the front panel (FIG. 4) so as to keep the average S-parameter around 0.500 (front panel, FIG. 4).

Also as part of the major time management scheme, the image refreshing period for the image visualization on the screen is user defined. FIG. 4 shows a user input field, 'Image Refresh' whose value serves the time between the successive refreshments, preferably in milliseconds. The spectrum is also refreshed in a time interval of 1-10 minutes (user input in 'Spectrum refresh' field of the front panel FIG. 4). In fact the quicker spectrum refresh does not provide any noticeable change in its shape.

For monitoring the system performance, there are several monitors on the front panel, FIG. 4. The 'rate' meter is one of them. This shows the average rate of annihilation peak events "T" coming inside the ±50 channel range. It gives an indication of the number of successfully processed annihilation peak events from which the efficiency of the system can be worked out since the annihilation line event rate from the detector can be monitored separately by single channel analyzer (SCA) and a rate meter. In one embodiment, there are also 'scan back log' monitor windows on the front panel which show an increasing trend (by number display) if all data coming to the data acquisition card buffer is not transferred into the imaging software. Preferably, this buffer should be kept constant with a small number for example, 2 digits. This may be achieved by setting the 'buffer size', which is another control window in the front panel. The settings of other parameters such as image refresh rate, matrix dimensions, and computational jobs influence this parameter. The spectrum plot, which can refresh about every 10 seconds, also helps in monitoring any electronic drift that occurs during long term accumulation.

FIG. 8A shows photograph of the symbol "e$^+$" made up of 0.5 mm thick kapton (polyimide) foil pasted on the surface of silicon wafer. The S-parameter image taken by the invented imager with 128×128 pixel resolution is shown in FIG. 8B.

FIG. 9A is the photograph of a monocrystalline Ni sample produced by high pressure torsion. The sample was produced by high pressure torsion. This means that the defect profile should be a radial distribution around the center of the sample. FIG. 9B is the S-parameter image of the sample where the parametric values are prominently distributed radially around the center making clear that that the defect profile is also distributed radially about the center. To draw a clearer inference from this S-parameter image data set, the user may take the S-parameter values along a row of pixels passing through the central region of the image. FIG. 9C is the bar-chart plot of the above mentioned taken along row 55 of FIG. 9B. The height distribution of the bars which stand for the S-parameter values of the corresponding pixels is gradually increasing from centre of the sample towards the periphery. This is a clear inference of the defect profile as was predicted by the sample supplier. The image in FIG. 9B is taken with stepper motor step width of 3.6 degrees in the y-direction which causes the observed vertical "striation". The step width of the motors could be reduced (to 0.9 degrees minimum) in which case a smoother image of the sample would be formed.

FIG. 18 shows two S-parameter scan images taken for n-type GaAs—Si doped—with carrier concentration of $10^{17}$ cm$^2$. FIG. 18A shows a 128×128 pixel resolution plot. There is a good deal of "granulation" in the image. Much of this comes from the poor statistical accuracy available on the S-parameter (stand. dev. $\Delta S=\pm 0.004$)—with only 15,000 events per pixel region. On the other hand in FIG. 18(b) the spatial resolution is decreased to a 64×64 pixel resolution plot and there is an improvement in image visualization produced through the decreased statistical error on S ($\Delta S=\pm 0.002$). Because of the natural spread of positrons from the source (~1 mm), it can be argued that this is an optimal resolution for scanning a 5×5 cm region—since the source spread does not permit any finer pixel region division. It is noted that FIG. 18B shows clearly the presence of some "hot" (white) regions that indicate the presence of regions with a higher concentration of defects. There are also some regions of the image where the image is darker than average and these may be interpreted as regions of low defect density.

In order to show more clearly the presence of defects in the wafer the S-parameter data of a single row is plotted in FIG. 18C. This is row 29 of the FIG. 18B image. As may be seen, the peaks and valleys are far in excess of the statistical allowance. Using S-parameter alone it is difficult to tell the defect type being mapped. In n-type, GaAs both negatively charged As and Ga vacancies are known to trap positrons. However the difference between maximum and minimum S-parameters is ~0.04, which is more than that expected for saturation trapping into monovacancies. In another embodiment of the system, the imager system uses an R-parameter in addition to the S-parameter.

The imager system as described finds easy extension to use with a focused monoenergetic positron beam. Here the term "focused" means that the beam diameter at the target must be 1 mm or less. This focused beam spot essentially replaces the small diameter positron source. The xy scanning by the dual stepper motor system is replaced by a rastering motion of the positron beam, which in turn is achieved by the displacement of the charged particle beam by appropriate application of time-varying (saw-tooth on y and triangular on x) magnetic fields supplied by x and y deflection coils. FIG. 7 is the block diagram depicting this complete plan of the S-parameter imager as used with a positron beam system. FIG. 5 and FIG. 6 give the side and cross-sectional elevations of the xy steering coils. Due to the strong axial magnetic field normally used in low energy positron beams the most appropriate form of deflection is adiabatic deflection in which a small sideways magnetic field causes a small change in the direction of net magnetic field and the positron motion down the beam. The gauge value of the wire and number of turns for one of the pairs of steering coils can easily be calculated by applying Ampere's Law to the coil system of FIG. 6, i.e., $B=\{[6.928\times 10^{-3}I]/r\}$ Gauss, where B is the sideways deflecting magnetic field, I is the current and r is the radius of the xy tube. In one embodiment, for a beam, in which a deflection field of 1 Gauss is required, each coil winding of 100 turns of gauge-22 wire is used. Each pair of coils has a resistance of about 7Ω which are used in conjunction with current amplifiers that can supply up to 1 A. FIG. 10 shows the xy signals. The X coils are being fed uniform triangular waves (Freq=50 Hz, Ampl=5V) from a signal generator. The y coil pairs were fed with ramp voltage (Freq=1 Hz, Amp=5V) from another signal generator. All the parameters of the signals can be varied/controlled as per the beam deflection needs of the user. Also the x and y signals are being fed to the data acquisition card and ANDed with the amplified output of the detector as in FIG. 7 so as to keep track of the position coordinates of each event.

A positron beam is used with the x, y scanning system. The S-parameter image taken with this type of slow positron beam is useful for thin film samples. FIG. 19A and FIG. 19B show the photograph of the symbol 'C' (0.4 μm thick aluminum deposited on a copper substrate) and the S-parameter image respectively. The edges of the image are not too sharp and some portions of the image are blurred as the beam spot is 1.5 mm diameter. The image improves as the beam spot is 0.5 mm or less. Additionally, the presence of some fast positron contamination in the beam causes blurred images. The removal of the contamination yields clearer images. A sub-millimeter beam and removing the fast contamination yields better quality images. In one embodiment, a micron size beam spots of mono-energetic positrons is used. If applied in conjunction with such micron-sized beams the imaging system will give an extremely high resolution image of micron sized electronic device structures. Moreover such images could be produced within reasonable operation times time with high beam intensity.

While specific embodiments of the invention have been shown and described in detail to illustrate the application of the inventive principles, it will be understood that the invention may be embodied otherwise without departing from such principles. Accordingly, the spirit and scope of the present invention is to be limited only by the following claims.

What is claimed is:

1. An instrumentation setup for processing imager electronic signals comprising:
    a spectroscopy amplifier;
    an SCA (Single Channel Analyzer);
    linear gates; and
    ADCs (Analog to digital converters).

2. The instrumentation set up for processing imager electronic signals of claim 1, further comprising:
    an X-axis frequency generator;
    a Y-axis frequency generator;
    an X-axis current amplifier;
    a Y-axis current amplifier; and
    an HP Ge Detector (High-Purity Germanium detector).

3. The instrumentation set up for processing imager electronic signals of claim 2, wherein an image is taken using a monoenergetic positron beam.

4. The instrumentation set up for processing imager electronic signals of claim 2, wherein an image is taken using a particular energy setting for positrons in case of a variable energy beam.

5. The instrumentation set up for processing imager electronic signals of claim 2, further comprising x and y deflection coils connected to said X-axis frequency generator and said Y-axis frequency generator so that a charged particle beam can be deflected electromagnetically to raster the positron beam across a specified area of a sample.

6. The instrumentation set up for processing imager electronic signals of claim 5, wherein the x and y deflection coils are wound with 22 gauge wire.

7. The instrumentation set up for processing imager electronic signals of claim 5, wherein the X deflection coils and the Y deflection coils have a number of turns calculated to meet a current supply capacity in order to produce a magnetic field strength for a desired deflection.

8. The instrumentation set up for processing imager electronic signals of claim 2, wherein the X-axis frequency generator is adapted to produce uniform triangular wave signals, and the Y-axis frequency generator is adapted to produce saw-tooth ramp voltage signals.

9. The instrumentation set up for processing imager electronic signals of claim 2, wherein the imager electronic signals comprise x and y signals which are current amplified to produce a specified magnetic field for a desired deflection of a positron beam.

10. The instrumentation set up for processing imager electronic signals of claim 2, wherein the linear gates comprise:
    a first linear gate, said first linear gate anding an output from the SCA and an output from the Y-axis frequency generator; and
    a second linear gate, the second linear gate anding the output from the SCA with an output from the X-axis frequency generator.

11. The instrumentation set up for processing imager electronic signals of claim 2, wherein the ADCs comprise:
    a first A/D converter for converting the output from the S spectroscopy amplifier;
    a second A/D converter for converting the output from the second linear gate; and
    a third A/D converter for converting an output from the first linear gate, wherein outputs of the A/D converters are processed to determine an S-parameter image.

12. The instrumentation set up for processing imager electronic signals of claim 1, further comprising LVDTs (Linear Variable Differential Transformers).

13. The instrumentation set up for processing imager electronic signals of claim 12, wherein the instrumentation set up is capable of generating an image based at least in part on a positron source scanning.

14. The instrumentation set up for processing imager electronic signals of claim 12, further comprising a detector and a preamplifier coupled to the detector wherein the spectroscopy amplifier is adapted to filter a charge integrated pulse output from the preamplifier.

15. The instrumentation set up for processing imager electronic signals of claim 12, wherein the SCA is adapted to provide TTL logic pulses in response to a peak amplitude voltage pulse from the spectroscopy amplifier falling within a narrow band of voltages signifying a 511 keV (annihilation event) gamma ray energy event.

16. The instrumentation set up for processing imager electronic signals of claim 12, further comprising: two linear gates adapted to switch in response to a TTL high being supplied from the SCA to produce x and y position coordinate information signals having pulse heights proportional to x and y displacements.

17. The instrumentation set up for processing imager electronic signals in claim 16, wherein the two linear gates are further adapted to provide x and y coordinate information in response to an annihilation event triggering an SCA/detector system.

18. The instrumentation set up for processing imager electronic signals in claim 17, wherein a recalculation of an S-parameter for a pixel occurs in response to the pixel receiving an event.

19. The instrumentation set up for processing imager electronic signals in claim 12, further comprising: a scanning instrument, wherein the LVDTs are fixed to the scanning instrument to provide coordinate signals.

20. The instrumentation setup for processing imager electronic signals of claim 1, wherein the instrumentation setup is capable of processing one or more nuclear electronic signals.

* * * * *